United States Patent [19]
Pease et al.

[11] Patent Number: 5,644,704
[45] Date of Patent: Jul. 1, 1997

[54] METHOD AND APPARATUS FOR VERIFYING THE CONTENTS OF A STORAGE DEVICE

[75] Inventors: Logan L. Pease, Reno; Delbert Richard, Sparks; Peter D. Dickinson, deceased, late of Reno, all of Nev., by Kathy E. Dickinson, executrix

[73] Assignee: International Game Technology, Reno, Nev.

[21] Appl. No.: 348,268

[22] Filed: Nov. 30, 1994

[51] Int. Cl.$^6$ .................................................. G06F 11/34
[52] U.S. Cl. ........................... 395/183.18; 371/21.5; 395/421.08; 395/183.16
[58] Field of Search ..................... 395/183.18, 183.16, 395/183.01, 185.01, 185.07, 421.08; 371/21.1, 21.5, 37.7

[56] References Cited

U.S. PATENT DOCUMENTS

| | | | |
|---|---|---|---|
| 3,825,905 | 7/1974 | Allen, Jr. | 395/200.19 |
| 3,838,264 | 9/1974 | Maker | 371/21.5 |
| 4,354,251 | 10/1982 | Hellwig et al. | 371/21.5 |
| 4,727,544 | 2/1988 | Brunner et al. | 371/21.5 X |
| 5,488,702 | 1/1996 | Byers et al. | 395/186 |

OTHER PUBLICATIONS

Crenshaw, Jack W. Jan. 1992 Implementing CRCs.
Unknown 1968/1972 Error Control.

*Primary Examiner*—Robert W. Beausoliel, Jr.
*Assistant Examiner*—Ly V. Hua

[57] ABSTRACT

A method and apparatus for verifying the contents of a storage device. A number of steps are involved in performing the verification. First, non-sequential data is written into each unused memory location of the storage device. Then, a non-associative technique is performed on contents of each memory location in the storage device starting at a randomly determined address in the storage device. Next, a final value from the non-associative technique is provided to a confirmation device for comparison with a set of predetermined resulting values. Then, the final value is compared to a resulting value, the resulting value being predetermined by applying the non-associative technique to pre-programmed contents of the storage device. Finally, one of two signals is generated. A first signal is generated indicating that the contents of the storage device are corrupted if the final value does not correspond to the resulting value. Alternatively, a second signal is generated indicating the contents of the storage device are uncorrupted if the final value corresponds to the resulting value.

21 Claims, 3 Drawing Sheets

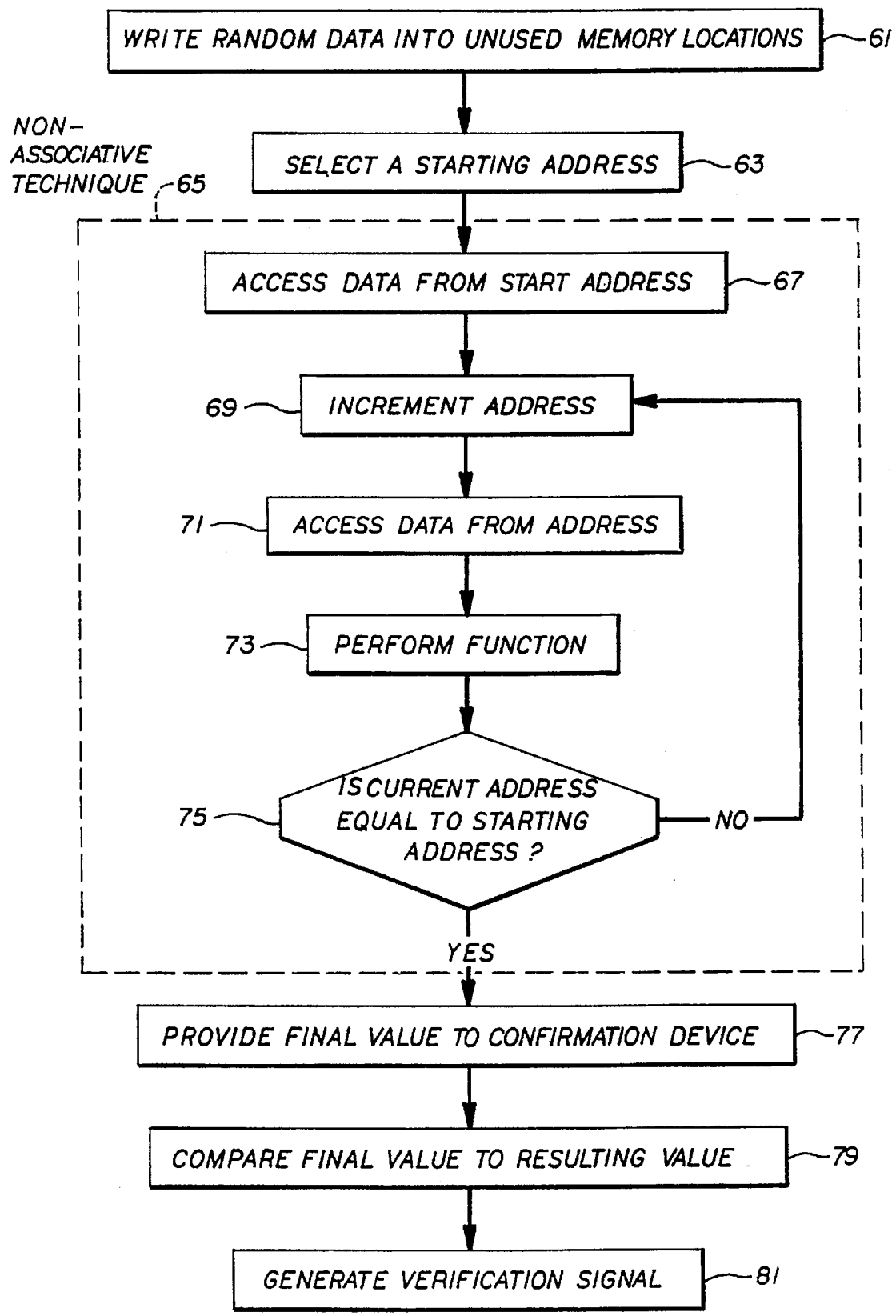

METHOD AND APPARATUS FOR VERIFYING THE CONTENTS OF A STORAGE DEVICE

BACKGROUND OF THE INVENTION

The present invention relates generally to verification of computer storage devices. In particular, the invention relates to a method and apparatus for verifying memories with a high level of security and confidence.

For many applications, it is necessary to verify the contents of computer storage devices to confirm that no corruption of data has occurred. Verification is especially important in areas where individuals may seek to alter the contents of a computer memory such as banking, state lottery applications, and other gaming operations, including slot and video gaming machines. To date, a program or set of data stored in a computer memory has been verified for authenticity by carrying out a number of steps. First, the memory chip is removed from the circuit board in which it is integrated. Second, the contents of each memory address is compared to a master chip containing a known data set. Third, if the contents of the tested chip match those of the master chip, the chip is replaced in the circuit board from which it was removed. However, if the contents do not match, the chip is replaced with a new one, the contents of which do match those of the master chip.

The problem with the previously known technique for verifying the contents of computer storage devices is that each chip must be individually removed and verified. In many cases, the devices to be checked are located in a wide range of geographic locations. This means that the party charged with verification must be physically present at the site of the device to be tested and remove each and every individual chip for testing. In the case of a lottery where hundreds, or even thousands of machines may be spread across one or more states, verification becomes impractical. Knowledge of the effort required to verify each individual machine may entice less scrupulous individuals to alter the memory of such a device in an attempt to set the outcome or otherwise cheat the lottery terminal. Of course, the same principals apply to bank machines, slot machines, or any other machine where an altering of the memory would benefit the person making the alteration.

Another problem associated with physical verification at the site of the device relates to the ability to download data from a central computer to devices connected in a network. Downloading allows a program or data to be sent from one device to another without the two devices being physically proximate to one another. However, if it is necessary to verify that the integrity of the downloaded data has been maintained, the convenience of downloading may be defeated because it would still be necessary to perform verification at the site of the machine to which the program or data is downloaded. Due to the problems presented, it is desirable to achieve an invention capable of remote verification of computer storage devices.

SUMMARY OF THE INVENTION

The present invention provides method and apparatus for remotely verifying the contents of computer storage devices. It accomplishes accurate verification by taking advantage of previously unused or blanked memory addresses. The benefits of the invention are numerous. The invention permits verification of a computer memory without the need to physically remove the memory chips from the circuit board. Remote verification eliminates the need to travel to the various machine sites, reducing cost and inconvenience. Further, remote verification reduces the chance that a memory chip will be unintentionally damaged during removal, replacement, or any time in between. Remote verification also makes it practical to verify large numbers of machines, and simultaneously discourages unscrupulous individuals who may be tempted to try to cheat a machine by altering its memory contents. Finally, the integrity of programs or data downloaded from a central computer to any number of connected remote units can be verified immediately and without added cost, ensuring the integrity of the transmitted data and reducing the chance that corrupted data will go undetected.

One aspect of the invention comprises a method of verifying the contents of a computer storage device. A number of steps are involved in performing the verification. First, non-sequential data is written into each unused memory location of the storage device. Then, a non-associative technique is performed on contents of each memory location in the storage device starting at a randomly determined address in the storage device. Next, a final value from the non-associative technique is provided to a confirmation device for comparison with a set of predetermined resulting values. Then, the final value is compared to a resulting value, the resulting value being predetermined by applying the non-associative technique to pre-programmed contents of the storage device. Finally, one of two signals is generated. A first signal is generated indicating that the contents of the storage device are corrupted if the final value does not correspond to the resulting value. Alternatively, a second signal is generated indicating the contents of the storage device are uncorrupted if the final value corresponds to the resulting value.

Another aspect of the invention involves the ability to perform verification from a remote location. In this case, the test unit confirming the integrity of the data is independent from the device in which the storage device is integrated. It may be a central computer to which the individual machines are connected; a test unit that can be connected to the machine in which the memory chip is located via cable; or a test unit connected to the machine in which the memory chip is located via modem. The test unit may even be the same unit as the one under test if a memory of the tested unit is programmed with the appropriate resulting values to which the data in the memory can be compared. The invention may also be independently employed by the device under test if its memory is programmed with the resulting values required for verification.

The invention resolves the problems inherent in the prior art by utilizing memory addresses that were previously left blank or intentionally set to zero. A further understanding of the nature and advantages of the invention will become apparent by reference to the remaining portions of the specification and the drawings.

BRIEF DESCRIPTION OF THE DRAWINGS

FIG. 5 is a flow chart illustrating the operation of the device of FIG. 4.

DESCRIPTION OF THE SPECIFIC EMBODIMENTS

Figure 1:
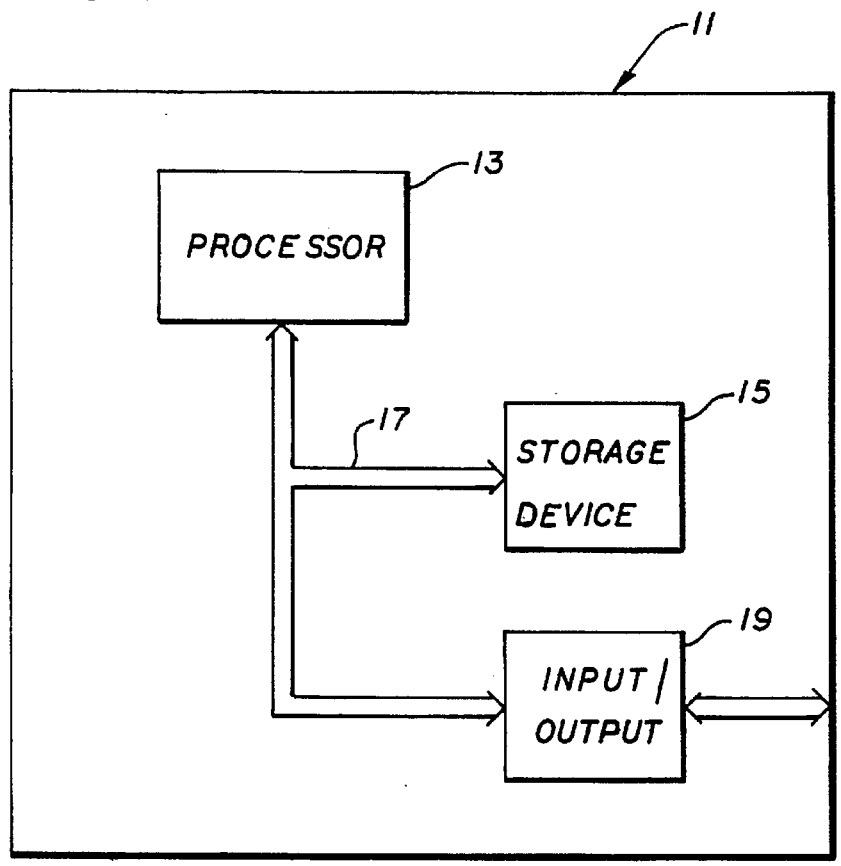
FIG. 1 is a block diagram of a circuit board, including a storage device for storing data to be verified.

Referring now to the drawings in which similar reference numerals indicate similar parts throughout the several drawings, FIG. 1 illustrates a circuit board 11 of the type in which the invention may be useful. Board 11 includes a processor 13 connected to a storage device or memory chip 15 between which data is communicated along bus 17. An input/output (I/O) device 19 is included to transmit data to and receive data from an external source such as a test unit used to verify the contents of storage device 15. Circuit board 11 may be used in any number of applications. By way of example, it may be the processor board used to control a lottery terminal or slot machine.

Figure 2:
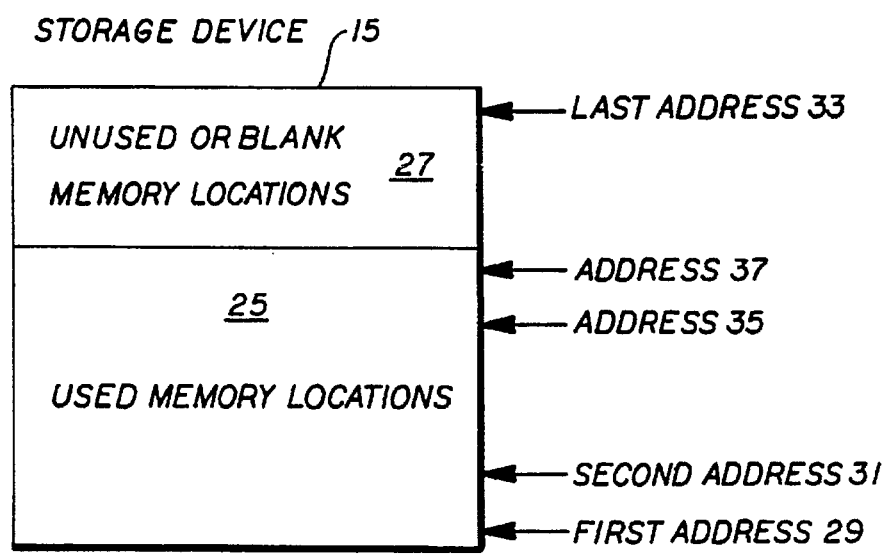
FIG. 2 is a block diagram of the structure of the storage device of FIG. 1.

Storage device 15 is shown in greater detail in FIG. 2. Storage device 15 is typically a read only memory (ROM) of the type manufactured by National Semiconductor of Santa Clara, Calif. and is separated into two portions. Other types of storage devices such as random access memory (RAM), programmable read only memory (PROM), erasable programmable read only memory (EPROM), electrically erasable programmable read only memory (EEPROM), and Flash memory may be substituted for the ROM. For simplicity, the remainder of the description will refer only to a generic storage device.

The first portion 25 of storage device 15 contains the memory locations in which a program or useful data is stored. The second, or remaining portion 27 is unused and contains the memory locations which are typically blanked or set to zero. In previous applications, the memory locations in second portion 27 served no useful purpose. The memory locations are addressed by number, such as first address 29 and second address 31 through last address 33. A representative address from a random location in storage device 15 is shown as address 35. Address 37 represents an address sequentially adjacent to address 35 and may be one before, or one after, address 35.

Figure 3:
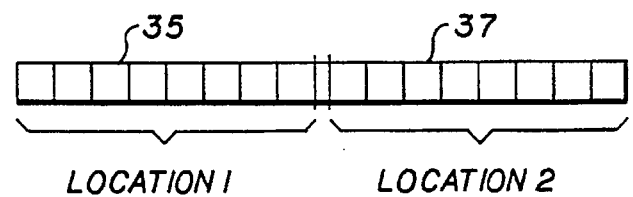
FIG. 3 is a representation of two adjacent unspecified memory locations within the storage device of FIG. 2.

FIG. 3 is an illustration of two adjacent memory locations or addresses 35 and 37 from storage device 15 of FIG. 2. These locations may be, for example, first address 29 and second address 31, or last address 33 and first address 29 assuming the memory locations of storage device 15 are considered to wrap around to the beginning upon reaching last address 33. Alternatively, these memory locations may be any other two locations from storage device 15, such as address 35 and address 37.

Figure 4:
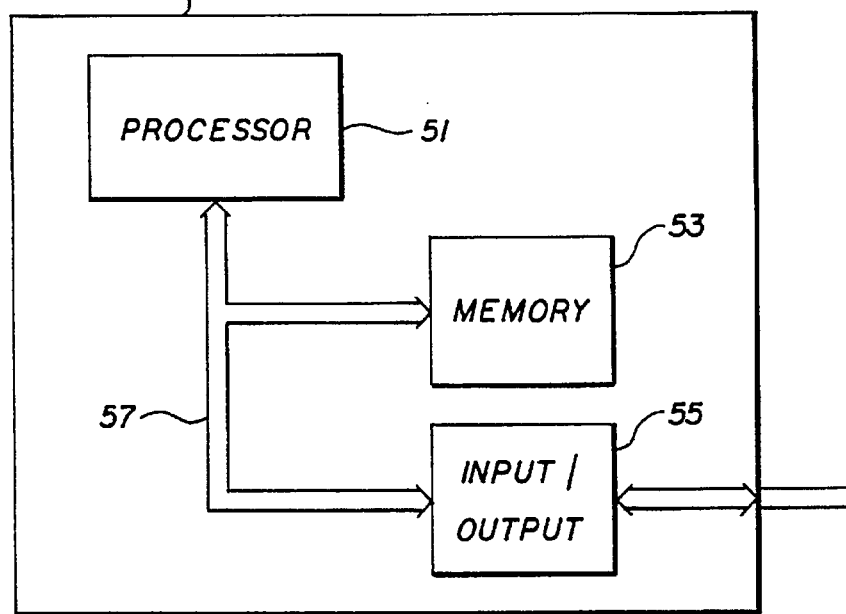
FIG. 4 is a block diagram of a device for performing verification connected to the circuit board of FIG. 1.
Figure 4:
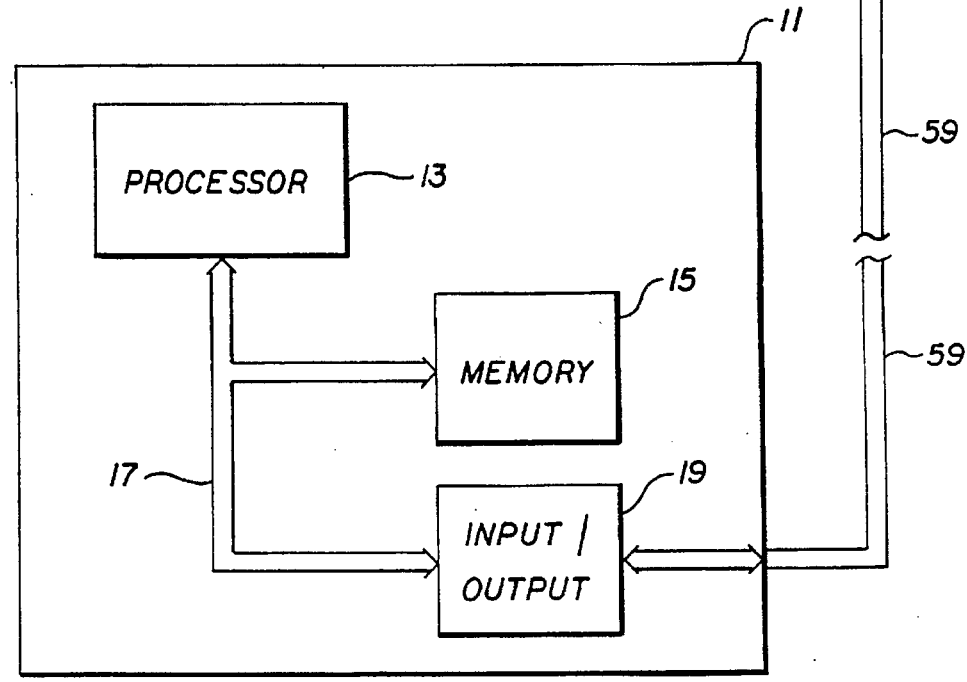

A test unit 49 connected to circuit board 11 is shown in FIG. 4. This test unit 49 illustrates a typical processor based system that may be used to verify the contents of storage device 15. A processor 51 carries out various mathematical functions in the verification process. In addition, a memory 53 stores dedicated programs for carrying out these functions or may be loaded temporarily with instructions for performing verification. Memory 53 or another storage device within test unit 49 must also contain a set of predetermined resulting values representing the different results of the verification depending upon the starting address selected as part of the verification process. An input/output (I/O) or communications device 55 provides test device 49 with the ability to communicate with the device containing the storage device being verified. A bus 57 connects each of the components of test unit 49 together. In addition, a connection is established to the unit under test via a cable 59. Cable 59 may also be a modem connection or a network connection.

Referring to the flow chart of FIG. 5 and the hardware of FIGS. 1–4, the process for verification of storage device 15 will now be explained. It should be understood that to perform the verification process, test unit 49 is connected via cable 59 (or via a modem or a network) to circuit board 11 contained within the device under test. It is also possible, that a test mode could be entered by the device under test in which processor 13 could be used to verify storage device 15 without the need to involve an external test unit. Before storage device 15 is installed in circuit board 11, storage device 15 is programmed by writing data or instructions into the addresses of first portion 25 of storage device 15. During this process, non-sequential data is generated and written (step 61) into second portion 27 of storage device 15. This non-sequential data provides the basis for the verification of the present invention. When verification is desired, a starting address from storage device 15 is selected (step 63). This address may be any address in storage device 15 whether located in first portion 25 or second portion 27. The first two addresses are represented by address 35 and address 37 shown in FIG. 3.

Once starting address 35 is selected, a non-associative technique (block 65) is employed to generate verification data. The non-associative technique includes a series of sub-steps. First, the data stored in starting address 35 is accessed (step 67) by test unit 49, or alternatively, by processor 13 of circuit board 11. The address counter (not shown) is then incremented (step 69). The data from the adjacent address 37 is accessed (step 71) and the non-associative function is performed (step 73). The function performed may be any one of a number of functions. For example, it may be: 1) multiplying the two numbers; 2) dividing the first number by the second number; 3) or some other mathematical manipulation of the numbers or cyclical redundancy check (CRC). The resulting number is substituted for the data of starting address 35. After performing the function (step 73), an inquiry is made as to whether starting address 35 has been reached (step 75). If not, the address is incremented (return to step 69) and the procedure is repeated until starting address 35 is reached.

It should be understood that selected starting address 35 does not always correspond to first address 29 in storage device 15. Therefore, it may be necessary to include additional steps to create a wrap around effect for the non-associative technique wrapping last address 33 back to first address 29. The process can then continue until selected starting address 35 is reached. One of ordinary skill in the art would recognize that other techniques may be used in place of incrementing the address to utilize the contents of the memory locations in storage device 15 in the verification process. For example, the same steps could be implemented by reversing the order in which the addresses are accessed. In this case, starting address 35 is selected in the same manner, but instead of incrementing the address as in step 69, the address is decremented.

Once starting address 29 is reached, the final value is provided to test unit 49 or confirmation device (step 77). This final value is compared to a resulting value (step 79) to determine whether the data has been corrupted or not. A set of resulting values is stored in memory 53 of test unit 49 and may be accessed, for example, through a look-up table. The look-up table contains resulting values corresponding to each possible starting address of storage device 15. The look-up table is established by recording results obtained from performing the non-associative technique on a set of uncorrupted data matching the data that was originally programmed in storage device 15. The resulting values are input to the look-up table and are accessed for verification during a comparison between the final value generated by the non-associative technique (step 79) and the appropriate resulting value. This comparison is performed by processor 51, or possibly processor 13.

Finally, a verification signal is generated (step 81) indicating the state of the memory contents. If the final value is equal to the resulting value, the data is in its proper form and has not been corrupted. If the final value is not equal to the resulting value, the data has been corrupted and storage device 15 should be replaced. It would be almost impossible for corrupted data to generate the same final value as the resulting data stored in memory 53 of test unit 49. This is due to the large number of non-associative functions performed during the verification process and the non-sequential nature of the data stored in second portion 27 of storage device 15.

In conclusion, the present invention overcomes the disadvantages of the prior art by utilizing non-sequential data stored in the unused portion of storage device 15 to generate verification data. While the above is a complete description of the preferred embodiments of the invention, various alternatives, modifications, and equivalents may be used. For example, the cyclical redundancy check may be substituted by other non-associative techniques without effecting the invention's usefulness. In addition, the remote verification may be performed by a test device connected in an already established network, via modem, or by cable hooked directly to the device to be tested. It is also possible for the device containing storage device 15 to perform independent verification provided the resulting values can be accessed. Therefore, the above description should not be taken as limiting the scope of the invention which is defined by the appended claims.

What is claimed is:

1. A method of verifying the contents of a computer storage device, comprising:
    writing non-sequential data into each unused memory location of the storage device;
    performing a non-associative technique on contents of each memory location in the storage device starting at a randomly determined address in the storage device;
    providing a final value from the non-associative technique to a confirmation device for comparison with a set of predetermined resulting values;
    comparing the final value to a resulting value, the resulting value being predetermined by applying the non-associative technique to pre-programmed contents of the storage device; and
    generating a first signal indicating the contents of the storage device are corrupted if the final value does not correspond to the resulting value or a second signal indicating the contents of the storage device are uncorrupted if the final value corresponds to the resulting value.

2. The method of claim 1 wherein the non-associative technique is applied sequentially starting at the randomly determined address through a last address in the storage device before wrapping around to a first address and continuing until an address preceding the randomly determined address is reached.

3. The method of claim 1 wherein the non-associative technique is applied in reverse sequence starting at the randomly determined address through a first address in the storage device before wrapping around to a last address and continuing until an address following the randomly determined address is reached.

4. The method of claim 1 wherein the non-associative technique is a cyclical redundancy check.

5. The method of claim 1 wherein the confirmation device is independent from a device in which the storage device is integrated.

6. The method of claim 5 wherein the confirmation device is a processor connectible to the device in which the storage device is integrated as part of a network of machines at a remote location.

7. The method of claim 5 wherein the confirmation device is a processor connectible to the device in which the storage device is integrated via a modem.

8. The method of claim 5 wherein the confirmation device is a processor connectible to the device in which the storage device is integrated via cable substantially near the device in which the storage device is integrated.

9. A computer programmed to verify the contents of a storage device, wherein the storage device includes a first portion for storing a program or data, and a second portion for storing non-sequential data, comprising:
    a memory for storing a predetermined set of resulting values, such that each of the resulting values corresponds to results of a non-associative technique performed by starting the non-associative technique at a different starting address in the memory;
    a communications device for transmitting data to and receiving data from a storage device under verification test;
    a processor connected to the memory and the communications device for accessing contents of addresses in the first and second portions of the storage device and performing the non-associative technique on the contents to provide a unique final value dependent upon a random starting address selected to perform the non-associative technique, and for comparing the unique final value and a corresponding resulting value obtained from the memory, the processor generating a first signal indicating the contents of the storage device have been corrupted if the final value does not correspond to the resulting value or a second signal indicating the contents of the storage device are uncorrupted if the final value corresponds to the resulting value.

10. The apparatus of claim 9 wherein the non-associative technique is applied sequentially starting at the randomly determined address through a last address in the storage device before wrapping around to a first address and continuing until an address preceding the randomly determined address is reached.

11. The apparatus of claim 9 wherein the non-associative technique is applied in reverse sequence starting at the randomly determined address through a first address in the storage device before wrapping around to a last address and continuing until an address following the randomly determined address is reached.

12. The apparatus of claim 9 wherein the non-associative technique is a cyclical redundancy check.

13. The apparatus of claim 9 wherein the confirmation device is independent from a device in which the storage device is integrated.

14. The apparatus of claim 13 wherein the confirmation device is a processor connectible to the device in which the storage device is integrated as part of a network of machines at a remote location.

15. The apparatus of claim 13 wherein the confirmation device is a processor connectible to the device in which the storage device is integrated via a modem.

16. The apparatus of claim 13 wherein the confirmation device is a processor connectible to the device in which the storage device is integrated via cable substantially near the device in which the storage device is integrated.

17. An apparatus for verifying the contents of a computer storage device, comprising:

a write circuit for writing non-sequential data into each unused storage device location of the storage device;

a processor for performing a non-associative technique on contents of each storage device location in the storage device starting at a randomly determined address in the storage device;

a circuit for providing a final value from the non-associative technique to a confirmation device for comparison with a set of predetermined resulting values; and a comparator for comparing the final value to a resulting value, the resulting value being predetermined by applying the non-associative technique to pre-programmed contents of the storage device wherein the comparator generates a first signal indicating the contents of the storage device are corrupted if the final value does not correspond to the resulting value or a second signal indicating the contents of the storage device are uncorrupted if the final value corresponds to the resulting value.

18. The apparatus of claim 17 wherein the non-associative technique is applied sequentially starting at the randomly determined address through a last address in the storage device before wrapping around to a first address and continuing until an address preceding the randomly determined address is reached.

19. The apparatus of claim 17 wherein the non-associative technique is applied in reverse sequence starting at the randomly determined address through a first address in the storage device before wrapping around to a last address and continuing until an address following the randomly determined address is reached.

20. The apparatus of claim 17 wherein the non-associative technique is a cyclical redundancy check.

21. The apparatus of claim 17 wherein the confirmation device is an independent device remote from a device in which the storage device is integrated.

* * * * *